United States Patent [19]

Maeda et al.

[11] Patent Number: 5,597,757
[45] Date of Patent: Jan. 28, 1997

[54] METHOD OF MANUFACTURING A SEMICONDUCTOR DEVICE INCLUDING BIPOLAR AND MOS TRANSISTORS

[75] Inventors: Takeo Maeda; Hiroshi Momose, both of Tokyo, Japan

[73] Assignee: Kabushiki Kaisha Toshiba, Kawasaki, Japan

[21] Appl. No.: 503,489

[22] Filed: Jul. 18, 1995

Related U.S. Application Data

[62] Division of Ser. No. 300,565, Sep. 6, 1994, abandoned, which is a continuation of Ser. No. 42,597, Apr. 2, 1993, abandoned.

[30] Foreign Application Priority Data

Apr. 3, 1992 [JP] Japan ..................... 4-82385

[51] Int. Cl.$^6$ ..................... H01L 21/70; H01L 27/00
[52] U.S. Cl. ..................... 437/59; 437/31; 148/DIG. 9
[58] Field of Search ..................... 437/31, 59; 148/DIG. 9

[56] References Cited

U.S. PATENT DOCUMENTS

| | | |
|---|---|---|
| 4,885,259 | 12/1989 | Osinski et al. ..................... 437/43 |
| 5,227,654 | 7/1993 | Momose et al. ..................... 257/370 |
| 5,238,850 | 8/1993 | Matsunaga et al. ..................... 437/20 |

FOREIGN PATENT DOCUMENTS

| | | |
|---|---|---|
| 58-124268 | 7/1983 | Japan . |
| 59-106152 | 6/1984 | Japan . |
| 60-258965 | 12/1985 | Japan . |
| 62-71268 | 4/1987 | Japan . |
| 62-147768 | 7/1987 | Japan . |
| 63-280450 | 11/1988 | Japan . |
| 3-20073 | 1/1991 | Japan . |

*Primary Examiner*—H. Jey Tsai
*Attorney, Agent, or Firm*—Finnegan, Henderson, Farabow, Garrett & Dunner, L.L.P.

[57] ABSTRACT

An npn bipolar transistor and a p-channel MOS transistor are formed on a p-type silicon substrate. The outer base electrode of the npn bipolar transistor and the gate electrode of the p-channel MOS transistor contain a p-type impurity and are composed of films consisting of the same material. The inner and outer bases are formed in a surface region of the p-type silicon substrate. The outer base is connected to the outer base electrode. The emitter electrode of the npn bipolar transistor is formed on the inner base. A laminated film constituted by a silicon oxide film and a silicon nitride film is formed on a p-type silicon substrate at a position between the outer base electrode and the emitter electrode.

6 Claims, 11 Drawing Sheets

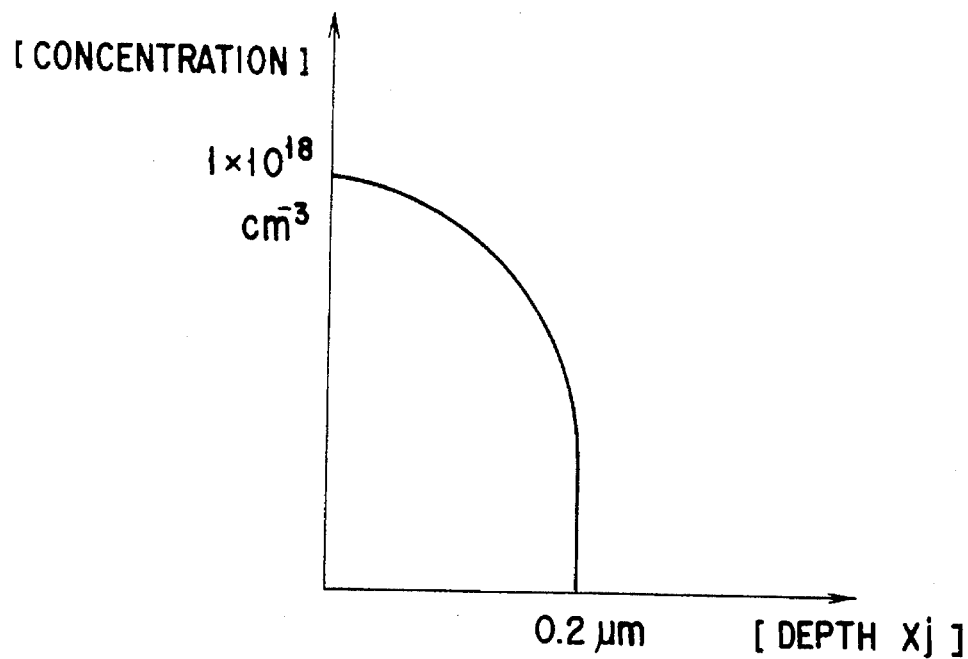
F I G. 6A
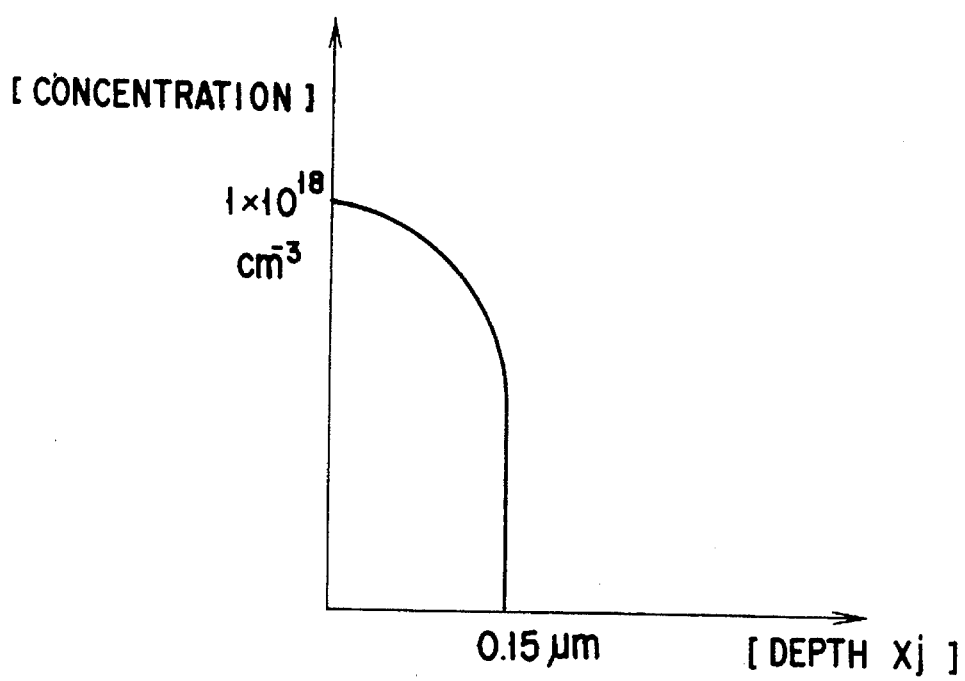
F I G. 6B

METHOD OF MANUFACTURING A SEMICONDUCTOR DEVICE INCLUDING BIPOLAR AND MOS TRANSISTORS

This is a division of application Ser. No. 08/300,565, filed Sep. 6, 1994, abandoned, which is a continuation of application Ser. No. 08/042,597, filed Apr. 2, 1993 abandoned.

BACKGROUND OF THE INVENTION

1. Field of the Invention

The present invention relates to an improvement in a semiconductor device (to be referred to as a BiMOS hereinafter) mounting both a bipolar transistor and a MOS transistor.

2. Description of the Related Art

In a BiMOS technique, a logic gate constituted by a combination of a bipolar transistor, which allows an integrated circuit to operate at high speed, and a MOS transistor, which allows an increase in integration density of elements constituting the integrated circuit and realizes a reduction in power consumption of the integrated circuit, is formed on a single chip.

In the process of manufacturing a conventional BiMOS, the gate electrode of a MOS transistor and the outer base electrode of a bipolar transistor are formed from the same film. In this case, in order to ensure a sufficient breakdown voltage of the gate electrode, the gate electrode is oxidized after it is formed.

In this oxidation step, however, an emitter opening portion of the bipolar transistor is also oxidized. This causes accelerated diffusion of boron in the inner base of the bipolar transistor, resulting in an increase in depth of the inner base. As a result, the performance of the bipolar transistor considerably deteriorates.

As described above, according to the conventional BiMOS, in the oxidation step after the gate electrode of a MOS transistor and the outer base electrode of the bipolar transistor are formed, the depth of an inner base is increased to cause a considerable deterioration in the performance of the bipolar transistor.

SUMMARY OF THE INVENTION

The present invention has been made to solve the above problem, and has as its object to provide a semiconductor device and a method of manufacturing the same, in which even if an oxidation step is performed after the gate electrode of a MOS transistor and the outer base electrode of a bipolar transistor are formed, the depth of an inner base is not increased, thereby improving the performance of the bipolar transistor.

In order to achieve the above object, a semiconductor device of the present invention includes a semiconductor substrate and a bipolar transistor formed on the semiconductor substrate. The bipolar transistor includes an outer base formed in a surface region of the semiconductor substrate, an inner base shallower than the outer base, an outer base electrode connected to the outer base, and an emitter electrode formed above the inner base region. The semiconductor device of the present invention also includes a MOS transistor formed on the semiconductor substrate. The MOS transistor includes a source and a drain formed in a surface region of the semiconductor substrate, and a gate electrode formed above the semiconductor substrate at a position between the source and the drain. The gate electrode is constituted by the same material as that for the outer base electrode of the bipolar transistor. In addition, the semiconductor device of the present invention includes a laminated film constituted by a silicon oxide film and a silicon nitride film. The laminated film is formed above the semiconductor substrate at a position between the emitter electrode of the bipolar transistor and the outer base electrode of the bipolar transistor.

In a method of manufacturing a semiconductor device according to the present invention, an oxide film is formed on a semiconductor substrate, and a nitride film is formed on the oxide film. Subsequently, the nitride film and the oxide film are etched to leave portions of these films only in a bipolar transistor formation region. After a gate oxide film is formed in a MOS transistor formation region, an impurity for forming an inner base is doped into the semiconductor substrate within the bipolar transistor formation region. The nitride film and the oxide film are etched to form an opening portion in an outer base electrode formation region. A conductive film is formed on the entire surface of the semiconductor substrate. The conductive film is etched to simultaneously form the gate electrode and the outer base electrode. Thereafter, thermal oxidation is performed to form oxide films at least on the side walls of the gate electrode and the outer base electrode and simultaneously form the inner base of the bipolar transistor in a surface region of the semiconductor substrate.

In a method of manufacturing a semiconductor device according to the present invention, a first oxide film is formed on a semiconductor substrate, and a nitride film is formed on the first oxide film. A second oxide film is formed on the nitride film. An impurity for forming an inner base is doped into the semiconductor substrate within a bipolar transistor formation region. An opening portion is formed in an outer base electrode formation region by etching the second oxide film and the nitride film. A conductive film is formed on the entire surface of the semiconductor substrate. The conductive film is etched to simultaneously form a gate electrode and an outer base electrode. Thereafter, thermal oxidation is performed to form oxide films at least on the side walls of the gate electrode and the outer base electrode and simultaneously form the inner base of the bipolar transistor in a surface region of the semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A and 6B are graphs showing a comparison between the depth of an inner base of a semiconductor device according to the present invention and the depth of an inner base of a conventional semiconductor device.

DETAILED DESCRIPTION OF THE PREFERRED EMBODIMENTS

An embodiment of the present invention will be described in detail below with reference to the accompanying drawings.

FIGS. 1 to 5 show a method of manufacturing a BiMOS according to an embodiment of the present invention. In this embodiment, an n-type impurity is doped into the gate electrode of a p-channel MOS transistor (to be referred to as a PMOS hereinafter).

Figure 1:
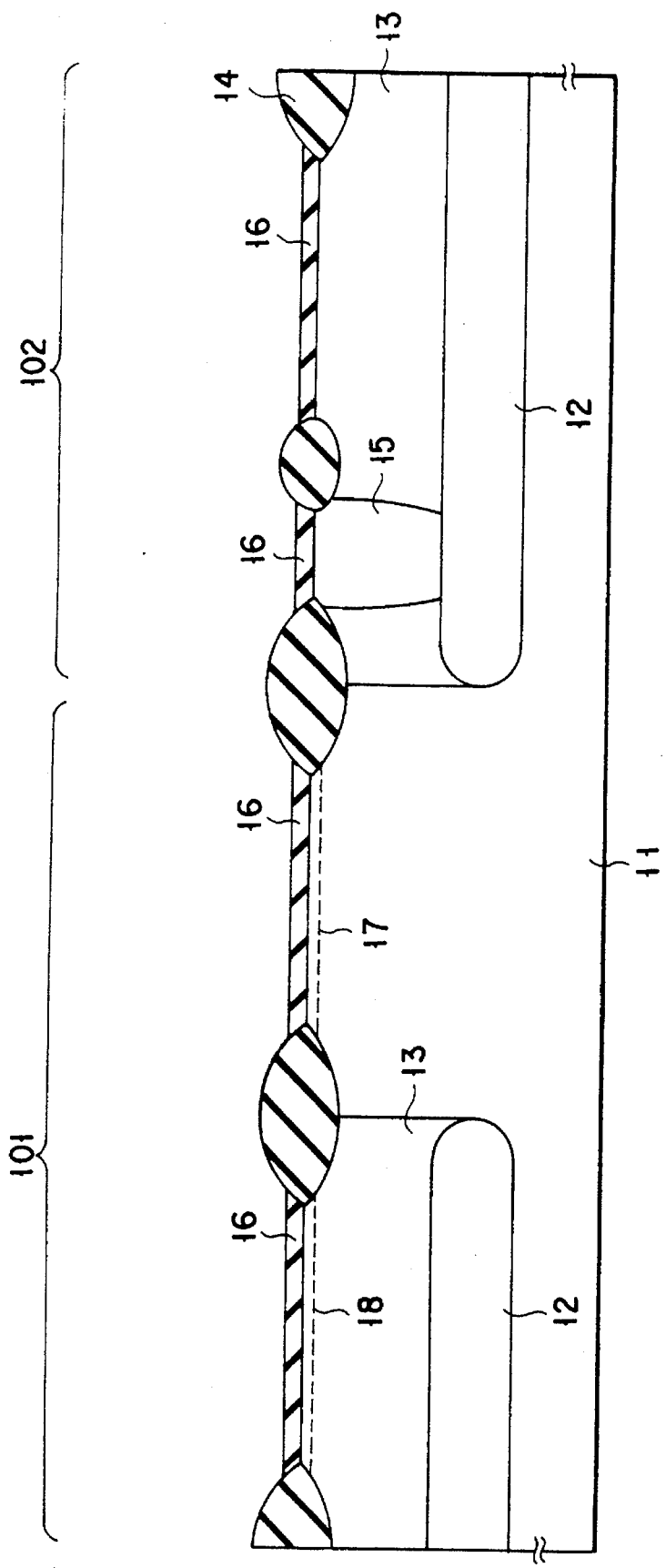
FIGS. 1 to 5 are sectional views showing a method of manufacturing a semiconductor device according to an embodiment of the present invention.

As shown in FIG. 1, a buried $n^+$-type region 12, an n-well region 13, a field oxide film 14, a collector electrode extraction region 15, and a dummy gate oxide film-16 having a thickness of 0.002 to 0.02 μm are formed on a p-type silicon substrate 11 by using a known method.

Channel ions are implanted into a channel ion implantation region 17 of an n-channel MOS transistor (to be referred to as an NMOS hereinafter) to control the threshold value of the NMOS. Channel ions are implanted into a channel ion implantation region 18 of the PMOS to control the threshold value of the PMOS.

Referring to FIG. 1, reference numeral 101 denotes a MOS transistor formation region (to be referred to as a MOS region hereinafter); and 102, a bipolar transistor formation region (to be referred to as a bipolar region hereinafter).

Figure 2:
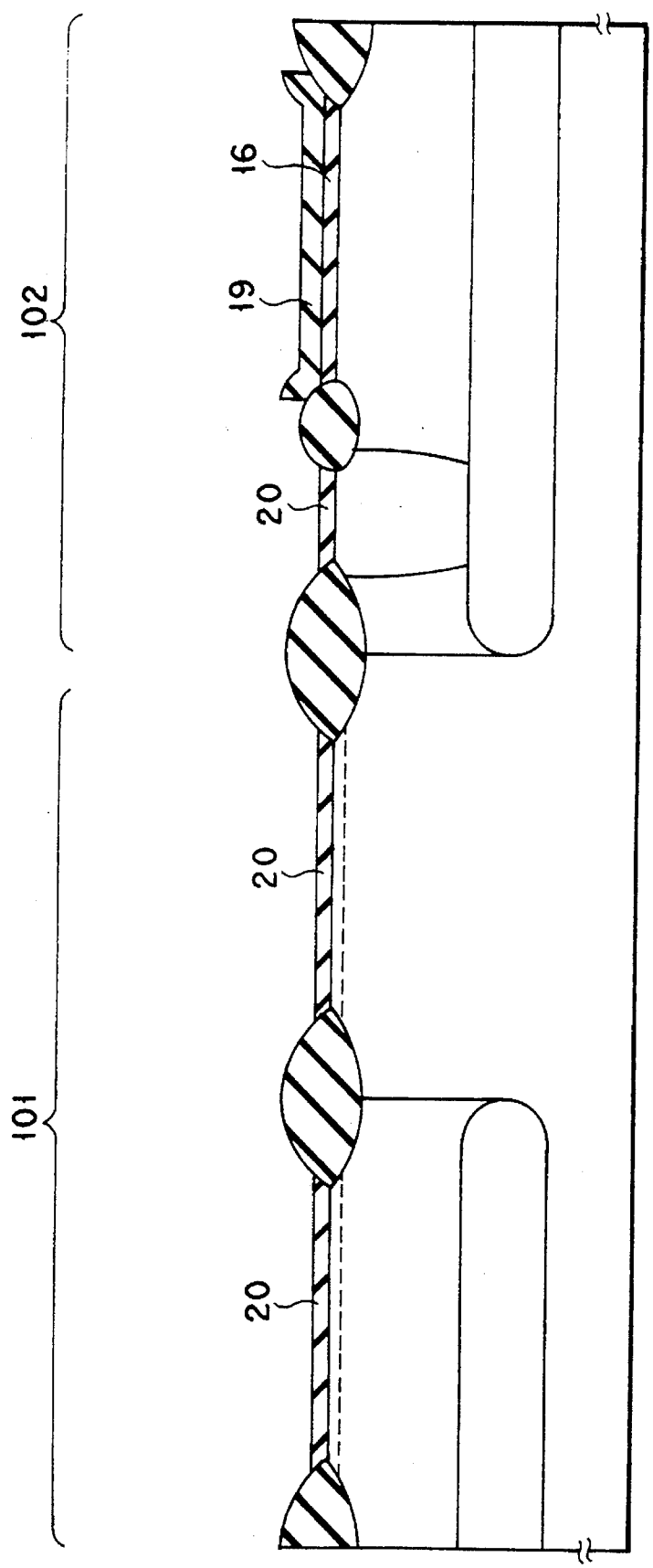

As shown in FIG. 2, a silicon nitride film 19 is deposited on the entire surface of the substrate 11 by the LPCVD method to a thickness of 0.0015 to 0.02 μm. In addition, the silicon nitride film 19 is etched By photolithography and chemical etching to leave the silicon nitride film 19 only in the bipolar region 102.

Boron (B) ions are implanted into an inner base formation region in the bipolar region 102 at an acceleration voltage of, e.g., 5 keV and a dose of, e.g., 1 to $8 \times 10^{13}/cm^2$.

Subsequently, the entire surface of the substrate 11 is etched by chemical etching to remove the dummy gate oxide film 16 from the MOS region 101. Note that the silicon nitride film 19 exists in a portion of the bipolar region 102. Therefore, a portion, of the dummy gate oxide film 16, on which the silicon nitride film 19 is not removed. Thereafter, a silicon oxide film (gate oxide film) 20 having a thickness of 0.005 to 0.011 μm is formed on the exposed upper surface of the substrate 11 at a temperature of about 800° C. by thermal oxidation.

Figure 3:
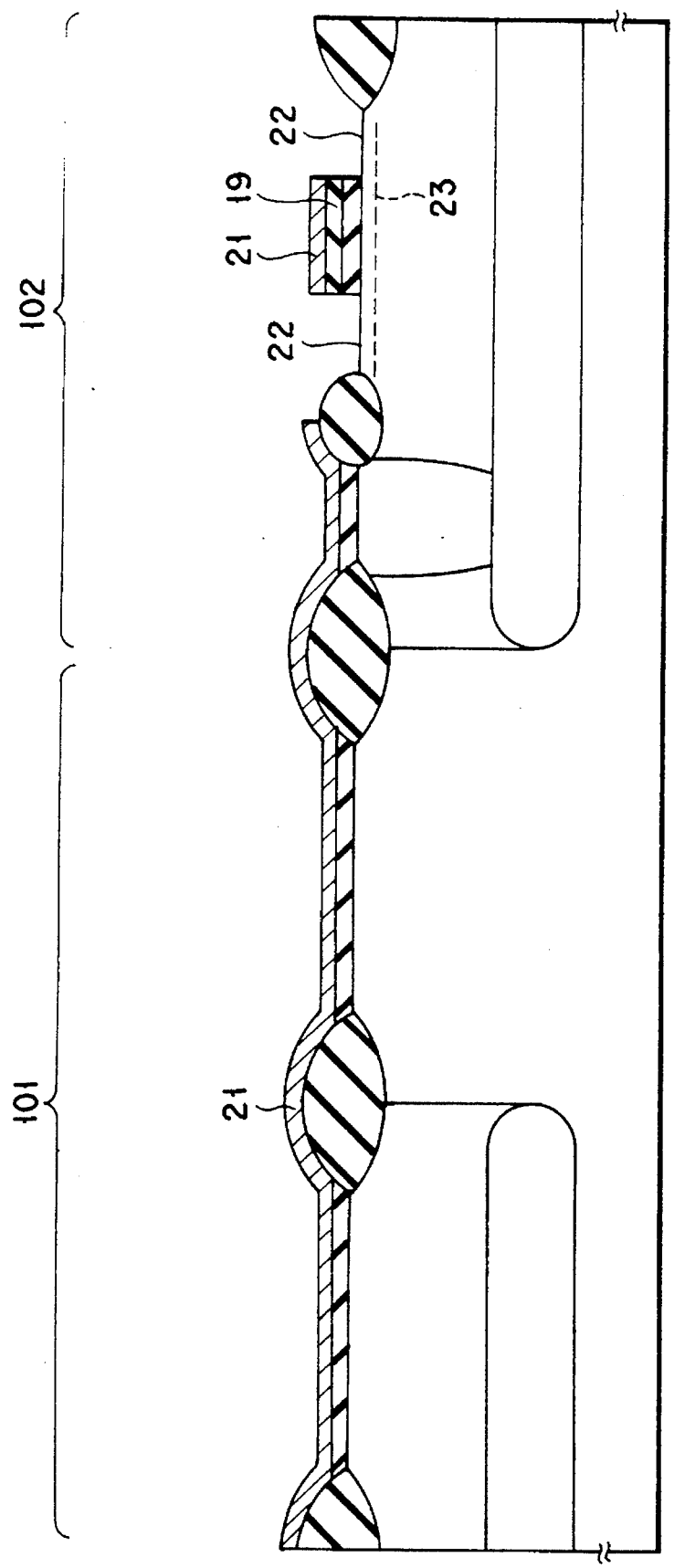

As shown in FIG. 3, a polysilicon film 21 is deposited on the entire surface of the substrate 11 to a thickness of 0.02 to 0.1 μm by the LPCVD method. In addition, the polysilicon film 21, the silicon nitride film 19, and the dummy gate oxide film 16 which exist in an outer base electrode formation region are etched by photolithography and chemical etching. As a result, an opening portion 22 for forming an outer base electrode is formed.

Figure 4:
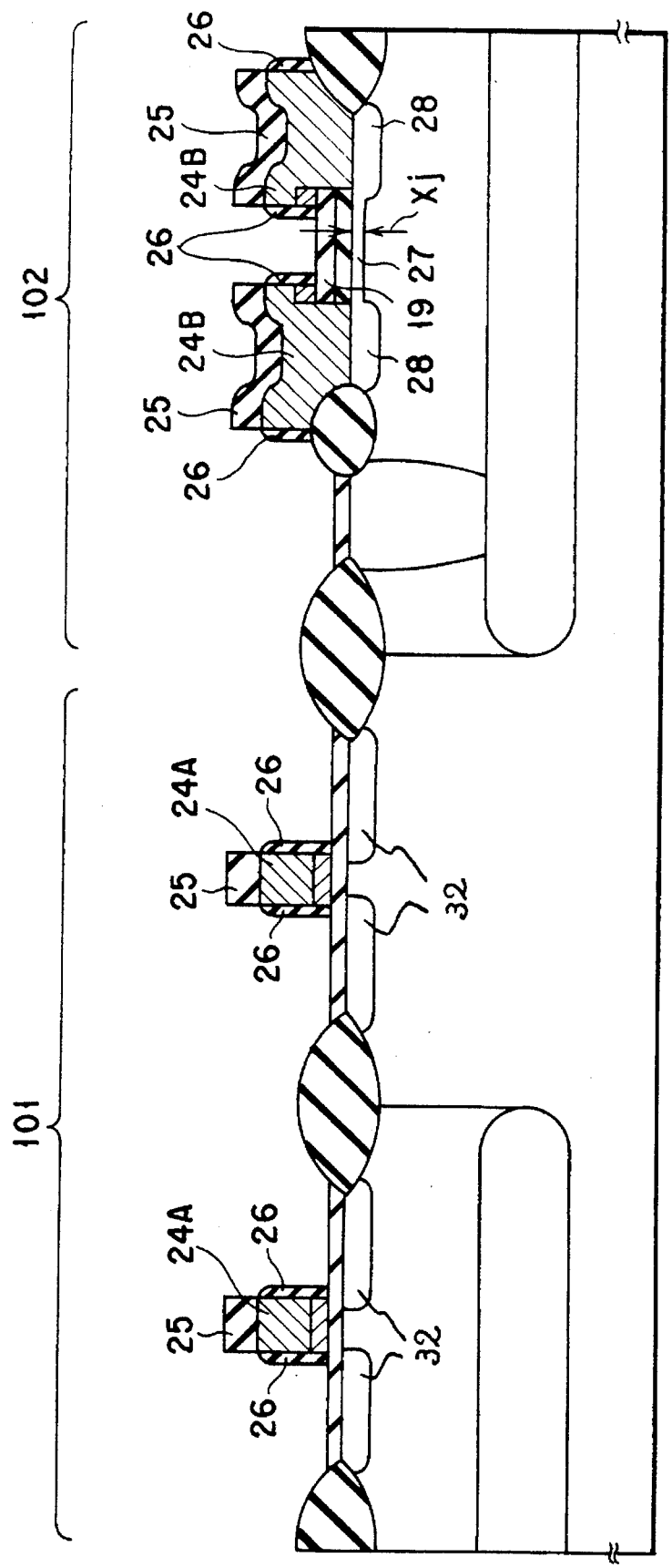

As shown in FIG. 4, a polysilicon film for forming the gate electrode of a MOS transistor and the outer base electrode of a bipolar transistor is deposited on the entire surface of the substrate 11 to a thickness of 0.1 to 0.4 μm by the LPCVD method. An n-type impurity, e.g., arsenic (As), is ion-implanted into the polysilicon film in a gate electrode formation region (including both the NMOS and the PMOS) in the MOS region 101 at an acceleration voltage of 40 keV and a dose of about $2 \times 10^{15}/cm^2$. In addition, a p-type impurity, e.g., boron fluoride ($FB_2$), is ion-implanted into a polysilicon film 24.in an outer base electrode formation region at an acceleration voltage of 35 keV and a dose of about $2 \times 10^{15}/cm^2$.

A $CVDSiO_2$ film 25 is deposited on the polysilicon film to a thickness of 0.1 to 0.2 μm by the CVD method. Thereafter, the $CVDSiO_2$ film 25 and the polysilicon film 24 are etched by photolithography and reactive ion etching. As a result, a gate electrode 24A and an outer base electrode 24B are respectively formed in the MOS region 101 and the bipolar region 102. At this time, the silicon nitride film 19 exists in an inner base formation region in the bipolar region 102. Therefore, the region in which the inner base of the bipolar transistor is formed is not exposed on the upper surface of the substrate 11.

Subsequently, in order to improve the electrical properties of an edge portion of the gate electrode 24A of the MOS transistor, for example, thermal oxidation is performed in an oxygen atmosphere at 800° to 900° C. for 10 to 60 minutes to round the edge portion of the gate electrode 24A. By this thermal oxidation step, $SiO_2$ films 26 are formed on the substrate 11 and the side walls of the gate electrode 24A within the MOS region 101. In addition, an inner base 27 and an outer base 28 are formed in the substrate 11 within the bipolar region 102.

In the thermal oxidation step, the silicon nitride film 19 exists on the inner base 27. For this reason, when the inner base 27 is formed, its upper surface is not oxidized, and accelerated diffusion of boron (B) in the inner base 27 is not caused either. Therefore, a depth Xj from the surface of the inner base 27 to the junction surface is not increased..

Subsequently, an n-type impurity, e.g., arsenic (As), is ion-implanted into the substrate 11 within the NMOS region at an acceleration voltage of 40 keV and a dose of about $2 \times 10^{15}/cm^2$. In addition, a p-type impurity, e.g., boron fluoride ($BF_2$), is ion-implanted into the substrate 11 within the PMOS region at an acceleration voltage of 35 keV and a dose of about $2 \times 10^{15}/cm^2$.

A source/drain 32 of the MOS transistor is formed in the MOS region.

Figure 5:
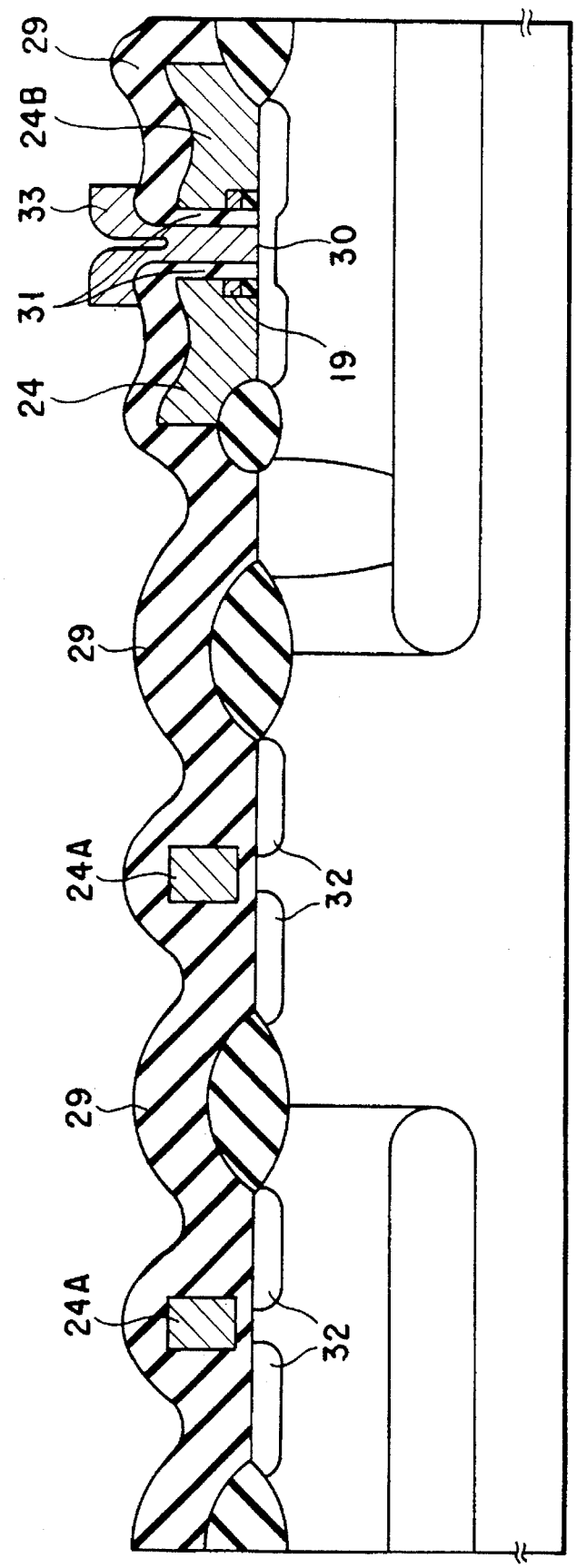

As shown in FIG. 5, a $CVDSiO_2$ film 29 is deposited on the entire surface of the substrate 11 to a thickness of 0.1 to 0.2 μm by the CVD method. The $CVDSiO_2$ film 29, the silicon nitride film 19, and the dummy gate oxide film 16 which are formed in an emitter electrode formation region are etched back by reactive ion etching. As a result, an emitter opening portion 30 is formed.

A polysilicon film is deposited on the entire surface of the substrate 11 to a thickness of 0.1 to 0.3 μm by the LPCVD method. Thereafter, the polysilicon film is etched by photolithography and chemical etching. As a result, an emitter electrode 33 is formed. An n-type impurity, e.g., arsenic (As), is ion-implanted into the emitter electrode 33 at an acceleration voltage of 60 keV and a dose of about $1 \times 10^{16}/cm^2$.

Although not shown, an insulating interlayer is deposited on the entire surface of the substrate 11, and contact holes and a metal wiring layer are formed by a known manufacturing method.

According to the above described manufacturing method, in the thermal oxidation step after the formation of the gate electrode;and the outer base electrode, the silicon nitride film 19 exists on the inner base 27. Therefore, the surface of the inner base 27 is not oxidized, and accelerated diffusion of boron (B) in the inner base 27 is not caused either.

With this method, as shown in, e.g., FIGS. 6A and 6B, the depth Xj of the inner base from the substrate surface to the junction surface, which is about 0.2 µm in the prior art (see FIG. 6A), can be suppressed to about 0.15 µm in the present invention (see FIG. 6B). That is, a high-performance bipolar transistor and a high-performance MOS transistor can be formed at once.

FIGS. 7 to 11 show a method of manufacturing a BiMOS according to another embodiment of the present invention. In this embodiment, a p-type impurity is doped into the gate electrode of a PMOS.

Figure 7:
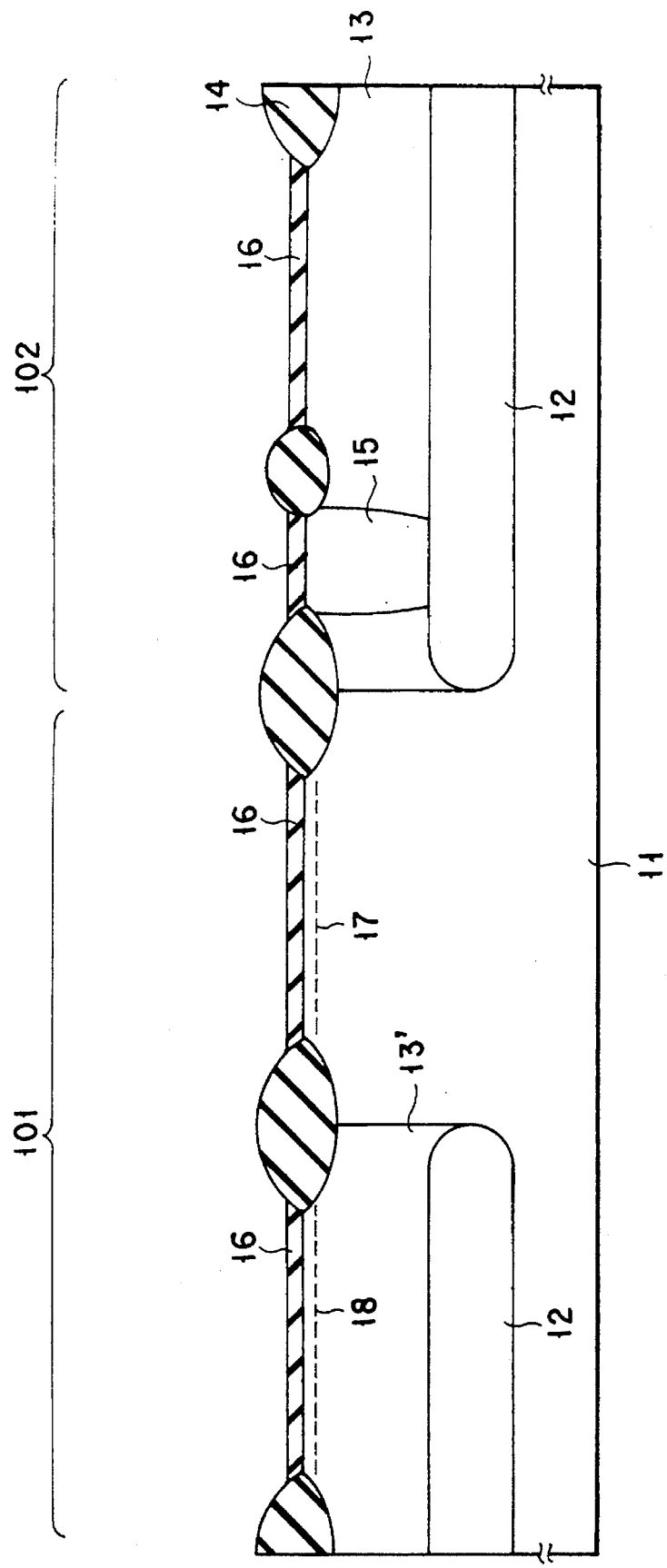
FIGS. 7 to 11 are sectional views showing a method of manufacturing a semiconductor device according to another embodiment of the present invention.

As shown in FIG. 7, a buried $n^+$-type region 12, an n-well region 13, a field oxide film 14, a collector electrode extraction region 15, and a dummy gate oxide film 16 having a thickness of 0.002 to 0.02 µm are formed on a p-type silicon substrate 11 by using a known method.

Channel ions are implanted into a channel ion implantation region 17 of an n-channel MOS transistor (to be referred to as an NMOS hereinafter) to control the threshold value of the NMOS. Channel ions are implanted into a channel ion implantation region 18 of the PMOS to control the threshold value of the PMOS.

Referring to FIG. 7, reference numeral 101 denotes a MOS transistor formation region (to be referred to as a MOS region hereinafter); and 102, a bipolar transistor formation region (to be referred to as a bipolar region hereinafter).

Figure 8:
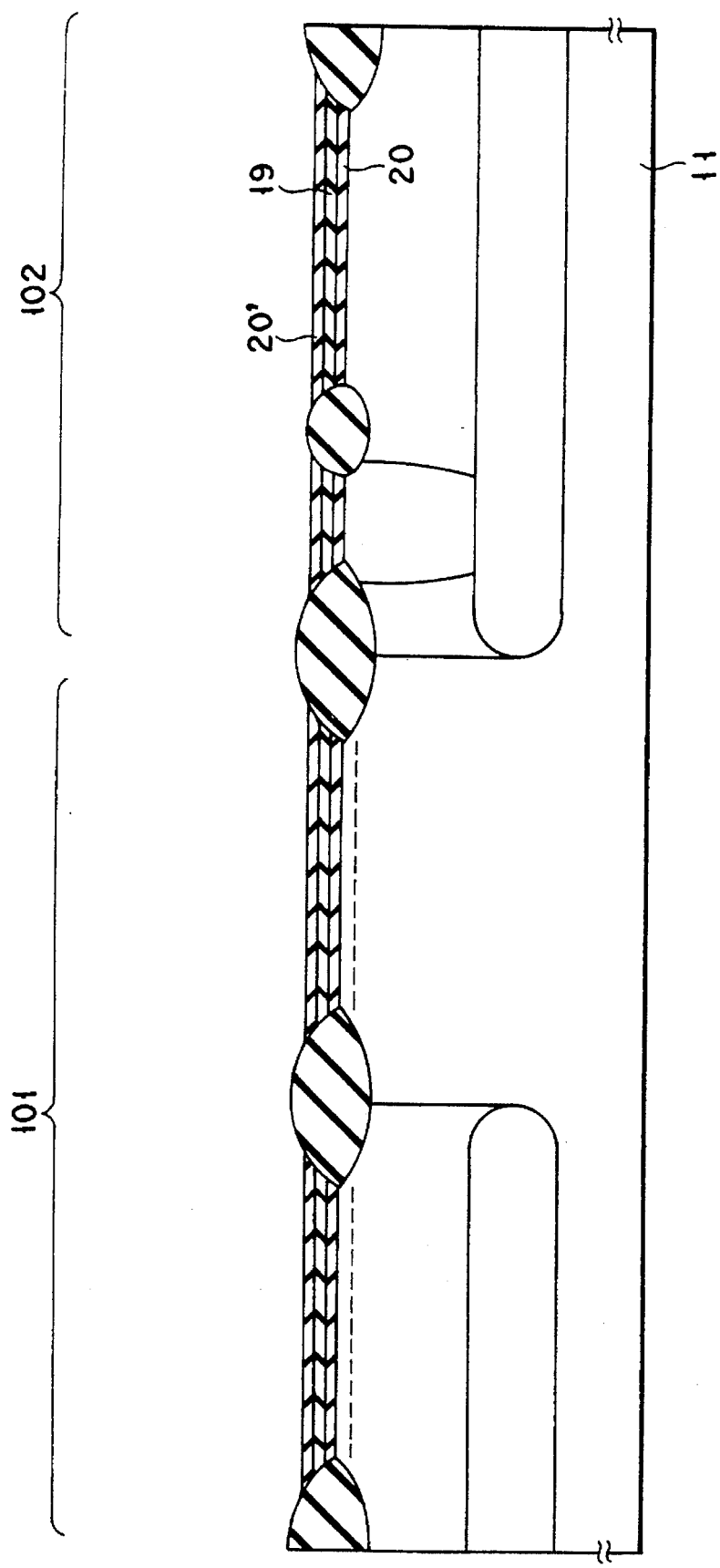

As shown in FIG. 8, the entire surface of the substrate 11 is etched by chemical etching to remove the dummy gate oxide film 16. A silicon oxide film (gate oxide film) 20 having a thickness of 0.005 to 0.011 µm on the exposed upper surface of the substrate 11 by performing thermal oxidation at a temperature of about 800° C. Subsequently, the surface of the silicon oxide film 20 is nitrided by a heat treatment in an ammonium atmosphere at a temperature of about 900° to 1,200° C. for 10 to 90 seconds, thus forming a silicon nitride film 19 on the silicon oxide film 20. Furthermore, a silicon oxide film 20' is formed on the silicon nitride film 19 by a heat treatment in an oxygen atmosphere at a temperature of about 900° to 1,200° C. for 10 to 90 seconds. Note that the silicon nitride film 19 may be deposited to a thickness of 0.0005 to 0.004 µm by using the LPCVD method instead of the above-described method.

Figure 9:
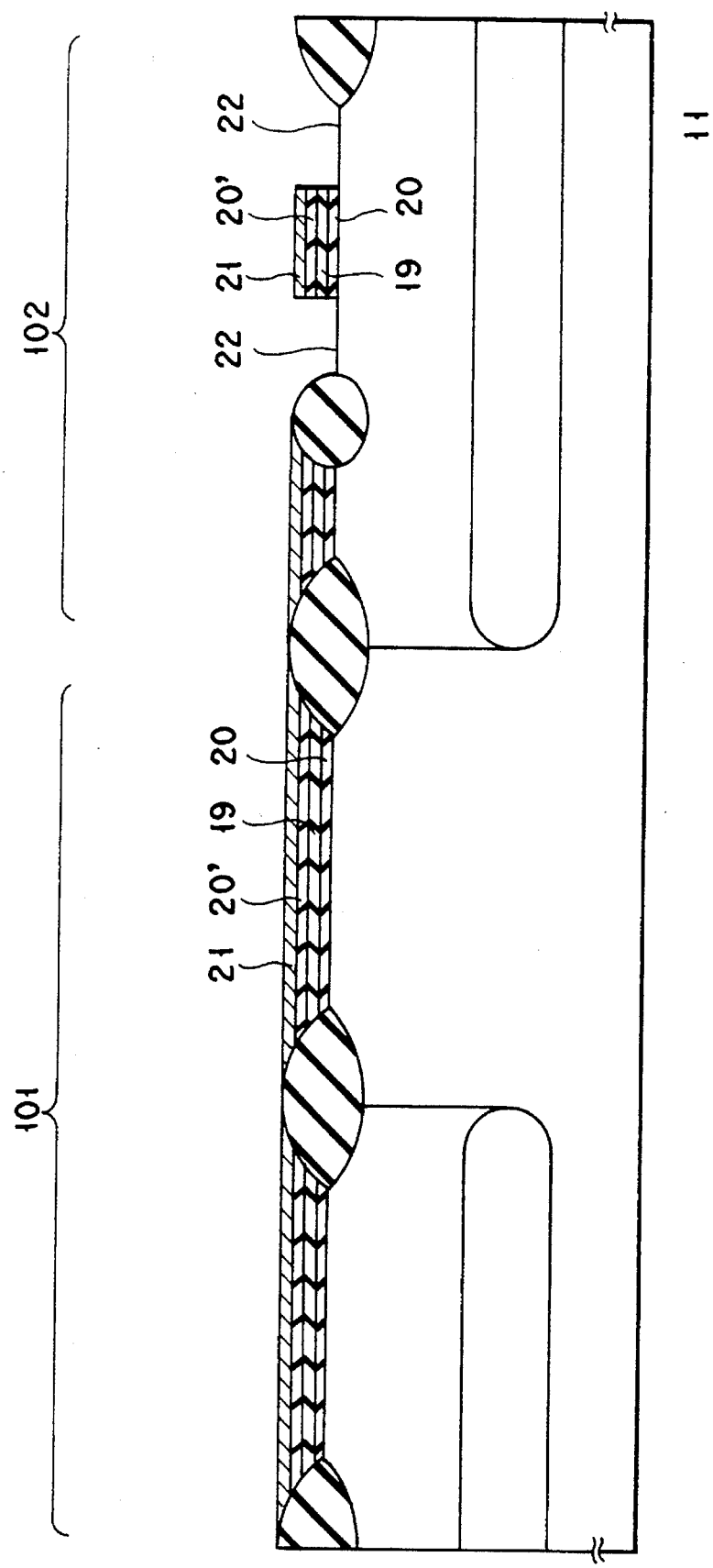

As shown in FIG. 9, a polysilicon film 21 is deposited on the entire surface of the substrate 11 to a thickness of about 0.05 µm by the LPCVD method. The silicon nitride film 19, the silicon oxide films 20 and 20', and the polysilicon film 21 which exist in an outer base electrode formation region are etched by photolithography and chemical etching so as to form an opening portion 22 for forming an outer base electrode.

Figure 10:
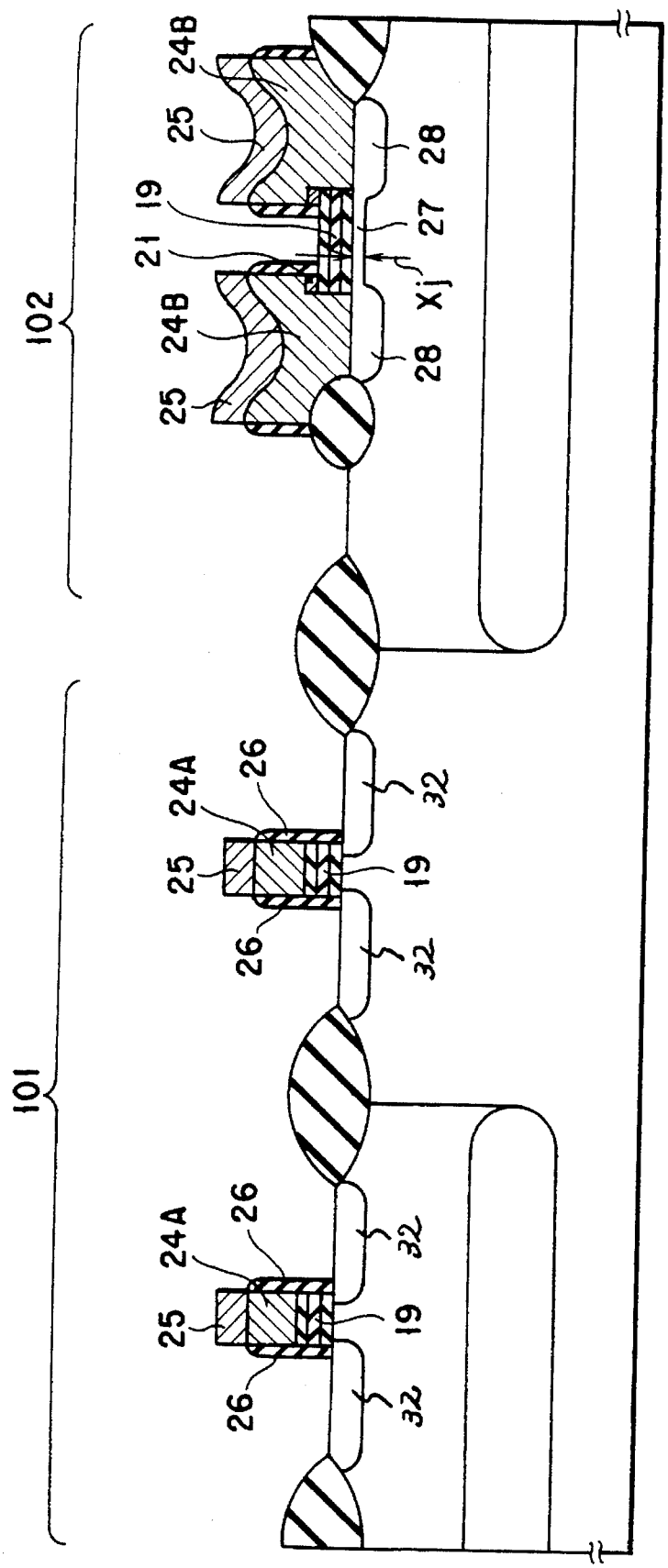

As shown in FIG. 10, boron (B) ions are implanted into an inner base formation region in the bipolar region 102 at an acceleration voltage of, e.g., 5 keV and a dose of, e.g., 1 to $8 \times 10^{13}/cm^2$. Thereafter, a polysilicon film 24 is deposited on the resultant structure to a thickness of 0.1 to 0.4 µm by the LPCVD method so as to form the gate electrode of a MOS transistor and the outer base electrode of a bipolar transistor. An n-type impurity, e.g., arsenic (As), is ion-implanted into a region, of the polysilicon film 24, in which the gate electrode of the NMOS is formed, at an acceleration voltage of 40 keV and a dose of about $2 \times 10^{15}/cm^2$. In addition, a p-type impurity, e.g., boron fluoride ($BF_2$), is ion-implanted into regions, of the polysilicon film 24, in which the gate electrode of the PMOS and the outer base electrode are formed, at an acceleration voltage of 35 keV and a dose of about $2 \times 10^{15}/cm^2$.

A $CVDSiO_2$ film 25 is deposited on the polysilicon film 24 to a thickness of 0.1 to 0.2 µm by the CVD method. Thereafter, the $CVDSiO_2$ film 25 and the polysilicon film 24 are etched by photolithography and ion etching to form a gate electrode 24A and an outer base electrode 24B. At this time, since the silicon nitride film 19 exists on the inner base in the bipolar region 102, the inner base is not exposed on the upper surface of the substrate 11.

In order to improve the electrical properties of an edge portion of the gate electrode 24A of the MOS transistor, for example, thermal oxidation is performed in an oxygen atmosphere at 800° to 900° C. for 10 to 60 minutes. By this thermal oxidation step, $SiO_2$ films 26 are formed on the substrate 11 and the side walls of the gate electrode 24A within the MOS region 101. In addition, an inner base 27 and an outer base 28 are formed in the substrate 11 within the bipolar region 102.

In the thermal oxidation step, since the silicon nitride film 19 exists on the inner base 27, the surface of the inner base 27 is not oxidized, and accelerated diffusion of boron (B) in the inner base 27 is not caused either. Therefore, a depth Xj of the inner base 27 from the substrate surface to the junction surface is not increased.

Subsequently, an n-type impurity, e.g., arsenic (As), is ion-implanted into the substrate 11 within the NMOS region at an acceleration voltage of 40 keV and a dose of about $2 \times 10^{15}/cm^2$. In addition, a p-type impurity, e.g., boron fluoride (BF2), is ion-implanted into the substrate 11 within the PMOS region at an acceleration voltage of 35 keV and a dose of about $2 \times 10^{15}/cm^2$.

A source/drain 32 of the MOS transistor is formed in the MOS region.

Figure 11:
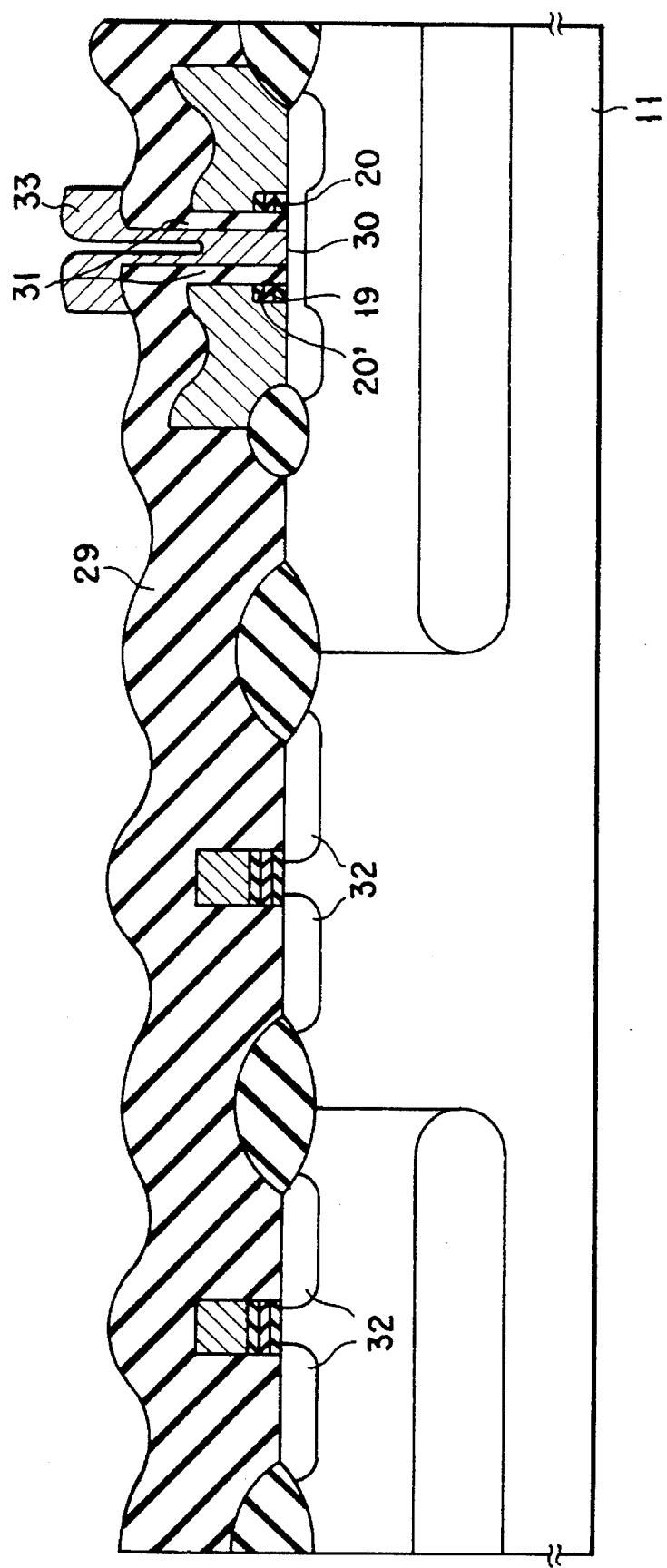

As shown in FIG. 11, a CVDSiO film 29 is deposited on the entire surface of the substrate 11 to a thickness of 0.1 to 0.2 µm by the CVD method. In addition, the $CVDSiO_2$ film 29, the polysilicon film 21, the silicon oxide film 20', the silicon nitride film 19, and the silicon oxide film 20 are etched back by reactive ion etching so as to form an emitter opening portion 30.

A polysilicon film 33 is deposited on the entire surface of the substrate 11 to a thickness of 0.1 to 0.3 µm by the LPCVD method. Thereafter, the polysilicon film 33 is etched by photolithography and chemical etching to form an emitter electrode 34. An n-type impurity, e.g., arsenic (As), is ion-implanted into the emitter electrode 33 at an acceleration voltage of 60 keV and a dose of about $1 \times 10^{16}/cm^2$ to decrease the resistance of the emitter electrode 33.

Although not shown, an insulating interlayer is deposited on the entire surface of the substrate 11, and contact holes and a metal wiring layer are formed by a known manufacturing method.

According to the above-described manufacturing method, in the thermal oxidation step after the formation of the gate electrode and the outer base electrode, the silicon nitride film 19 exists on the inner base 27. For this reason, the surface of the inner base 27 is not oxidized, and accelerated diffusion of boron (B) in the inner base 27 is not caused either. Therefore, the same effects as those of the previous embodiment can be obtained.

In the above-described two embodiments, the gate electrode and the outer base electrode are composed of only polysilicon films. However, the present invention is not limited to this. For example, each electrode may use a laminated structure constituted by a silicide film and a polysilicon film.

According to the semiconductor device having the above-described arrangement and the manufacturing method, a nitride film exists on an inner base. That is, the surface of the inner base is protected by the nitride film. With this protection, even if an oxidation step is performed after the gate electrode of a MOS transistor and the outer base electrode of a bipolar transistor are formed, the surface of the inner base is not oxidized. Therefore, a high-performance bipolar transistor and a high-performance MOS transistor can be provided. More specifically, an increase in maximum cutoff frequency can be achieved, i.e., from 12 GHz (a conventional bipolar transistor) to 20 GHz (a bipolar transistor according to the present invention).

In addition, either of the embodiments can be applied to a case wherein an n-type impurity is doped into a PMOS. In a case wherein a p-type impurity is doped into the gate electrode of a PMOS, according to the latter embodiment, since a gate insulating film has a laminated structure, i.e., an oxide film/nitride film/oxide film structure, variations in the threshold value of a MOS transistor in a heat treatment can be prevented.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming a oxide film on a semiconductor substrate;

forming a nitride film on the oxide film;

etching the nitride film and the oxide film such that only those portions of the nitride and oxide films formed over a bipolar transistor formation region of the semiconductor substrate remain;

forming a gate oxide film over a MOS transistor formation region of the semiconductor substrate;

doping impurities for forming an inner base region into the bipolar transistor formation region;

etching the remaining nitride and oxide films to form a first opening to an outer base electrode formation region;

forming a conductive film on an entire surface of the semiconductor substrate;

etching the conductive film to form a gate electrode on the MOS transistor formation region, an outer base electrode in the first opening, and a second opening to the nitride film over the inner base region; and performing thermal oxidation to form oxide films at least on a surface of the gate electrode and a surface of the outer base electrode, thereby rounding an edge portion of the gate electrode and an edge portion of the outer base electrode.

2. The method according to claim 1, further comprising the steps of etching those portions of the nitride and oxide films in a bottom portion of the second opening and forming an emitter electrode in the second opening after the thermal oxidation performance step.

3. The method according to claim 1, wherein the thermal oxidation step is performed for approximately 10 to 60 minutes in an oxygen atmosphere having a temperature of 800° to 900° C.

4. A method of manufacturing a semiconductor device, comprising steps of:

forming a first oxide film on a semiconductor substrate;

forming a nitride film on the first oxide film;

forming a second oxide film on the nitride film;

doping impurities into a bipolar transistor formation region of the semiconductor substrate to form an inner base region;

etching the second oxide film, the nitride film and the first oxide film to form a first opening to an outer base electrode formation region of the bipolar transistor formation region;

forming a conductive film on an entire surface of the semiconductor substrate;

etching the conductive film to form a gate electrode over a MOS transistor formation region of the semiconductor substrate, an outer base electrode in the first opening, a second opening to the second oxide film over the inner base region; and performing thermal oxidation to form oxide films at least on a surface of the gate electrode and on a surface of the outer base electrode, thereby rounding an edge portion of the gate electrode and an edge portion of the outer base electrode.

5. The method according to claim 4, further comprising the steps of etching those portions of the second oxide, nitride and first oxide films in a bottom portion of the second opening, and forming an emitter electrode in the second opening after the thermal oxidation performance step.

6. The method according to claim 4, wherein the thermal oxidation step is performed for approximately 10 to 60 minutes in an oxygen atmosphere having a temperature of 800° to 900° C.

* * * * *